United States Patent [19]

De La Moneda et al.

[11] 4,445,267

[45] May 1, 1984

[54] MOSFET STRUCTURE AND PROCESS TO FORM MICROMETER LONG SOURCE/DRAIN SPACING

[75] Inventors: Francisco H. De La Moneda, Tucson, Ariz.; Robert C. Dockerty, Poughkeepsie, N.Y.

[73] Assignee: International Business Machines Corporation, Armonk, N.Y.

[21] Appl. No.: 335,953

[22] Filed: Dec. 30, 1981

[51] Int. Cl.³ .................... H01L 21/265; H01L 21/28
[52] U.S. Cl. ........................................ 29/571; 29/578; 29/591; 357/23
[58] Field of Search .................... 29/571, 578, 591; 148/1.5; 357/23 S, 41

[56] References Cited

U.S. PATENT DOCUMENTS

| | | | |
|---|---|---|---|
| 4,062,699 | 12/1977 | Armstrong | 148/1.5 |
| 4,145,459 | 3/1979 | Goel | 427/88 |
| 4,201,603 | 5/1980 | Scott, Jr. et al. | 148/174 |
| 4,209,349 | 6/1980 | Ho et al. | 148/187 |
| 4,209,350 | 6/1980 | Ho et al. | 148/188 |
| 4,234,362 | 11/1980 | Riseman | 148/187 |
| 4,244,001 | 1/1981 | Ipri | 357/44 |
| 4,256,514 | 3/1981 | Pogge | 148/1.5 |
| 4,324,038 | 4/1982 | Chang et al. | 29/571 |
| 4,334,348 | 6/1982 | Trenary et al. | 29/571 |
| 4,358,340 | 11/1982 | Fu | 156/643 |
| 4,359,816 | 11/1982 | Abbas | 29/571 |
| 4,366,613 | 1/1983 | Ogura et al. | 29/571 |
| 4,375,713 | 3/1983 | Tonnel | 29/571 |

OTHER PUBLICATIONS

H. B. Pogge, *IBM Technical Disclosure Bulletin*, "Narrow Line-Width Masking Method", Nov. 1976, vol. 19, No. 6, pp. 2056-2058.

S. A. Abbas et al., *IBM Technical Disclosure Bulletin*, "Extending the Minimal Dimensions of Photolithographic . . . ", Sep. 1977, vol. 20, No. 4, pp. 1376-1378.

"A New Edge-defined Approach for Sub-micrometer MOSFET Fabrication," by W. R. Hunter et al. *IEEE Electron Device Letters*, vol. EDL-2, No. 1, Jan. 81, pp. 4-6.

"Sub-micrometer Polysilicon Gate CMOS/SOS Technology," by A. C. Ipri et al., *IEEE Transactions on Electron Devices*, vol. ED-27, No. 7, Jul. 80, pp. 1275-1279.

"A Novel Sub-micron Fabrication Technique," by T. N. Jackson et al., *IEDM 1979 Conference Volume*, pp. 58-61.

*Primary Examiner*—Aaron Weisstuch
*Attorney, Agent, or Firm*—George O. Saile

[57] ABSTRACT

A method for fabricating a semiconductor integrated circuit structure having sub-micrometer gate length field effect transistor devices is described wherein a surface isolation pattern is formed in a semiconductor substrate which isolates regions of the semiconductor within the substrate from one another. Certain of these semiconductor regions are designated to contain field effect transistor devices. A first insulating layer such as silicon dioxide which is designated to be in part the gate dielectric layer of the field effect transistor devices is formed over the isolation pattern surface. Then a conductive layer, a second silicon dioxide layer, a first silicon nitride layer, a polycrystalline silicon layer and a second nitride layer are formed thereover. The multilayer structure is etched to result in a patterned polycrystalline silicon layer having substantially vertical sidewalls some of which sidewalls extend across certain of the device regions. A well controlled sub-micrometer thickness layer is formed on these vertical sidewalls by thermal oxidation of the polycrystalline silicon surfaces. The patterned layer is then removed which leaves the pattern of sub-micrometer thickness silicon dioxide sidewall layer portions of which extend across certain of the device regions. The sidewall layer is utilized as a mask in etching the first silicon nitride layer, the second silicon dioxide layer and the conductive layer to form the gate electrode of the field effect transistor devices in the conductive layer having the length of the sidewall coating. Ion implantation is then accomplished adjacent to the gate electrode to form the desired source/drain element for the field effect devices in the device regions. The conductive layer and resulting gate electrode may be composed of polycrystalline silicon metal silicide, polycide (a combination of layers of polycrystalline silicon and metal silicide) or the like.

24 Claims, 11 Drawing Figures

MOSFET STRUCTURE AND PROCESS TO FORM MICROMETER LONG SOURCE/DRAIN SPACING

TECHNICAL FIELD

This invention relates to semiconductor integrated circuit structures and method for manufacturing such integrated circuits which have field effect transistor devices therein having a sub-micrometer gate length.

CROSS REFERENCES TO RELATED APPLICATIONS (1) Patent application Ser. No. 335,891, filed Dec. 30, 1981, entitled "Sub-micrometer Channel Length Field Effect Transistor Process and Resulting Structure", by R. C. Dockerty.

(2) Patent application Ser. No. 335,893, filed Dec. 30, 1981, entitled "Fabrication Process of Sub-micrometer Channel Length MOSFET", By J. Riseman and P. J. Tsang, now U.S. Pat. No. 4,419,809.

(3) Patent application, Ser. No. 335,892, filed Dec. 30, 1981 entitled "Self-aligned Field Effect Transistor Process", by J. Riseman, now U.S. Pat. No. 4,419,810.

(4) Patent application, Ser. No. 335,894, filed Dec. 30, 1981, entitled "A Method to Fabricate Stud Structure for Self-aligned Metalization", by S. A. Abbas and I. E. Magdo, now U.S. Pat. No. 4,424,621.

BACKGROUND ART

The integrated circuit technology has a need to obtain narrow line widths in the range of 1 micrometer or less by extending standard photolithography techniques and avoiding the need to use the more expensive and complex techniques such as electron beam or X-ray lithography. One such technique is described by H. B. Pogge in *IBM Technical Disclosure Bulletin*, November 1976, Vol. 19, No. 6, pp. 2057–2058, entitled "Narrow Line Widths Masking Method". This method involves the use of a porous silicon followed by the oxidation of the porous silicon. Another technique is described by S. A. Abbas et al. in the *IBM Technical Disclosure Bulletin*, Vol. 20, No. 4, September 1977, pp. 1376–1378. This method describes the use of polycrystalline silicon masking layers which are made into a mask by first using an intermediate mask of oxidation blocking material, such as silicon nitride in the formation of polycrystalline silicon. Line dimensions below about 2 micrometers may be obtained by this technique.

U.S. Pat. Nos. 4,209,349 and 4,209,350 by I. T. Ho et al., U.S. Pat. No. 4,234,362 by J. Riseman and U.S. Pat. No. 4,256,514 by H. B. Pogge describe methods for forming narrow dimensioned, for example, sub-micrometer regions on a silicon body. These patents all involve the formation of substantially horizontal surfaces and substantially vertical surfaces on a silicon body and then forming a layer of a very narrow dimension on both the substantially horizontal and substantially vertical surfaces. This layer is then subjected to an anisotropic etching process such as by reactive ion etching, to substantially remove the horizontal layer while leaving the vertical layer substantially intact. The vertical layer dimension is adjusted depending upon the original thickness of the layer applied. In this way such a narrow dimension region as 1 micrometer or less is obtained.

There has been significant effort in the integrated circuit field to develop processes for making sub-micrometer channel length field effect transistor with a high degree of channel length control. Examples of this work are described in "A New Edge-defined Approach for Sub-micrometer MOSFET Fabrication" by W. R. Hunter et al., *IEEE Electron Device Letters*, Vol. EDL-2 No. 1, January 1981, pp. 4–6, "Sub-micrometer Polysilicon Gate CMOS/SOS Technology" by A. C. Ipri et al. published in *IEEE Transactions on Electron Devices*, Vol. ED-27, No. 7, July 1980, pp. 1275–1279 and "A Novel Sub-micron Fabrication Technique" by T. N. Jackson et al. published in *IEDM* 1979 *Conference Volume*, pp. 58–61. The first paper relies on the reactive ion etching technique to form a sidewall silicon dioxide. The second paper utilizes a technique involving lateral diffusion of boron. The third method uses the plating of a metal on the edge of a conventionally patterned metal layer. Other short channel field effect transistor devices are illustrated in the W. E. Armstrong U.S. Pat. No. 4,062,699; J. Goel U.S. Pat. No. 4,145,459 and J. H. Scott, Jr. U.S. Pat. No. 4,201,603. The Armstrong patent utilizes an ion implantation and diffusion process to narrow the channel length of his MOSFET. The Goel patent utilizes a process sequence that involves the use of a recess formed in the portion of the semiconductor body and further involves the plating of metal films on each side of the recess until the spacing between the metal films across the recess is equal to desired length of the gate. The Scott, Jr. patent controllably dopes an edge of a polysilicon layer and then is able to remove the undoped polysilicon by etching it with a material which does not etch the doped polysilicon region.

It is therefore desirable to provide a high density, short channel field effect transistor which can be integrated into integrated circuit structures that is useful in memory or logic. It is also useful to have such short channel field effect transistors isolated from one another with dielectric isolation.

SUMMARY OF THE PRESENT INVENTION

In accordance with the present invention a method for fabricating a semiconductor integrated circuit structure having sub-micrometer gate length field effect transistor devices is described wherein a surface isolation pattern is formed in a semiconductor substrate which isolates regions of the semiconductor within the substrate from one another. Certain of these semiconductor regions are designated to contain field effect transistor devices. A first insulating layer such as silicon dioxide which is designated to be in part the gate dielectric layer of the field effect transistor devices is formed over the isolation pattern surface. Then a conductive layer, a second dioxide layer, a first silicon nitride layer, a polycrystalline silicon layer and a second nitride layer are formed thereover. The multilayer structure is etched to result in a patterned polycrystalline silicon layer having substantially vertical sidewalls some of which sidewalls extend across certain of the device regions. A well controlled sub-micrometer thickness layer is formed on these vertical sidewalls by thermal oxidation of the polycrystalline silicon surfaces. The patterned layer is then removed, which leaves the pattern of sub-micrometer thickness silicon dioxide sidewall layer portions of which extend across certain of the device regions. The sidewall layer is utilized as a mask in etching the first silicon nitride layer, the second silicon dioxide layer and the conductive layer to form the gate electrode of the field effect transistor devices in the conductive layer having the length of the sidewall coating. Ion implantation is then accomplished adjacent to the gate electrode to form the desired source/drain element for the field effect devices in the device regions. The conductive layer and resulting gate electrode may be composed of polycrystalline silicon, metal silicide, polycide (a combination of layers of polycrystalline silicon and metal silicide) or the like.

A semiconductor integrated circuit structure having a gate length larger than two times the sub-micrometer gate length of the preceding paragraph device may also be formed within regions of the semiconductor substrate isolated from one another. The process proceeds as in the above described process except that portions of the pattern of sub-micrometer thickness silicon dioxide sidewall layer extend as spaced pairs across certain of the device regions. A resist layer is utilized as a mask over the mid-section of the gate between the pair of sidewall layer lines. The resist in conjunction with the sidewall layers are utilized as a mask in etching the first silicon nitride layer and the first polycrystalline silicon layer to form the gate electrode of this field effect transistor device in the first polycrystalline silicon layer. The resist is removed. Ion implantation is then accomplished adjacent to the gate electrode to form the desired source/drain element for the field effect devices in the device regions.

DISCLOSURE OF THE INVENTION

Referring now more particularly to FIGS. 1 through 11 there is illustrated an embodiment for fabricating a sub-micrometer channel length field effect transistor in a high density integrated circuit structure. There is also shown in this embodiment the technique for obtaining sub-micrometer channel length devices as well as a field effect transistor having a channel length larger than twice the sub-micrometer channel length. These devices may be fabricated simultaneously. The process is illustrated to form N channel MOSFET integrated circuits. However, it would be obvious that P channel field effect transistors can alternatively be formed by the present embodiment by simply reversing the polarity of the various elements of the transistors and associated regions.

Figure 1:
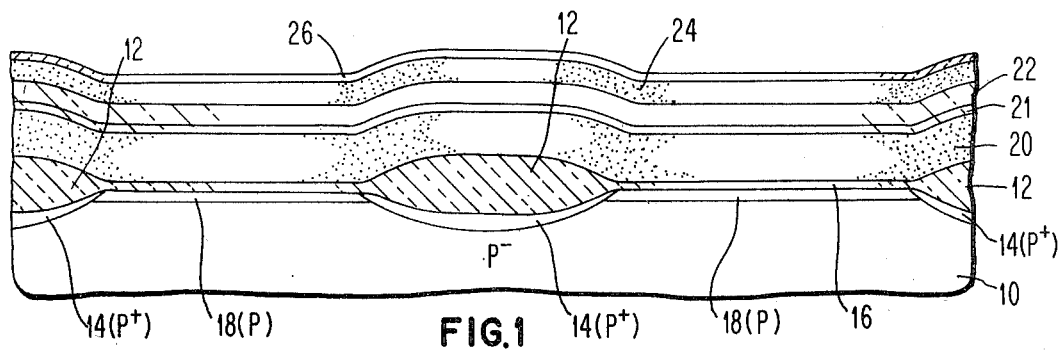
FIGS. 1 through 11 schematically illustrate the process for forming the sub-micrometer channel length field effect transistors together with other field effect transistors having a channel length larger than the sub-micrometer channel length devices.

The first series of steps involve the formation of the structure for isolating regions of monocrystalline silicon from one another in a P-type <100> crystallographic oriented silicon substrate 10 as thus can be seen with reference to FIG. 1. The isolation may preferably be partial dielectric isolation using materials such as silicon dioxide, glass, polyimide, etc., alone or in combinations. The preferred pattern of partial dielectric isolation 12 defines monocrystalline silicon surface regions wherein field effect devices will ultimately be formed. There are many ways in the art to form dielectric isolation regions of this type. It is preferred to use the process described in the Magdo et al. patent application Ser. No. 150,609 filed June 7, 1971 or Peltzer U.S. Pat. No. 3,648,129. Alternately, the process described in the J. A. Bondur et al., U.S. Pat. No. 4,104,086 can be used. In that patent application and the just mentioned patents, processes for forming partial dielectric isolation region 12 are described in detail. A P+ region 14 is typically formed under the dielectric isolation layer region 12 to prevent a formation of an inversion layer and the resulting electrical leakage between isolated monocrystalline regions under the isolation region 12.

Briefly, the recessed dielectric isolation region 12 and 14 may be formed by first thermally oxidizing the surface of the silicon substrate 10 to form a silicon dioxide layer (not shown) thereon. A silicon nitride layer (not shown) is then deposited by chemical vapor deposition thereover. The silicon nitride layer has openings formed therein at the desired location of the isolation regions by conventional lithography and etching techniques. The P+ regions 14 are formed by the ion implantation of boron through the silicon dioxide layer in the opening in the silicon nitride layer. The silicon nitride layer forms an effective mask to the penetration of the boron ions in the remaining areas covering the surface of the wafer. The recessed oxide isolation region 12 is then grown by placing the wafer in an oxidation ambient for a time sufficient to form the recessed oxidation regions 12. The silicon nitride and silicon dioxide layers are now removed from the surface of the silicon wafer. The surface isolation pattern in the semiconductor silicon substrate which isolates regions of the semiconductor within the substrate from one another is now formed.

A first insulating layer 16 is formed on the surface of the silicon body 10. This layer is preferably thermally grown silicon dioxide which is designated to be in part the gate dielectric layer upon the surface of the silicon substrate. However, the layer may alternatively be composed of silicon dioxide, silicon nitride, aluminum trioxide or the like or combinations of the foregoing. The layer is preferably thermally grown in oxygen or oxygen-water vapor ambient at a temperature of about 970° C. to form a thermal silicon dioxide layer. The preferred thickness of this layer is about 25 nanometers. A second method for growing silicon dioxide involves the use of chemical vapor deposition from $SiH_4$ and $O_2$ at about 450° C. or $SiH_2Cl_2$ and $N_2O$ at a temperature of about 800° C. under atmospheric or low pressure conditions. The deposition of silicon nitride is usually formed by chemical vapor deposition using the following process conditions: $SiH_4$, $NH_3$ and $N_2$ carrier gas at a temperature of about 800° C. under atmospheric or low pressure conditions as described, for example, in the V. Y. Doo U.S. Pat. No. 4,089,992. Where the insulating layer is formed of a combination of silicon dioxide and silicon nitride, the thicknesses of these layers are, for example, of 20 to 30 nanometers silicon nitride and 10 to 30 nanometers silicon dioxide.

The surface conductivity of the P- substrate 10 is adjusted where the field effect transistors are to be formed. Their associated threshhold voltage is adjusted by using, for example, a boron ion implantation of about $1 \times 10^{12}/cm^2$ dosage at approximately 7 KeV to produce surface P region 18.

There is now deposited a first polycrystalline silicon layer 20 over the entire surface having the surface isolation pattern and over the silicon dioxide layer 16. A polycrystalline silicon layer is deposited by using, for example, silane in a hydrogen ambient in the temperature range of about 500° C. to 1,000° C. and preferably about 600° C. The operative thickness of the polycrystalline silicon is between about 100 to 1000 nanometers with 250 nanometers preferred. The polycrystalline silicon layer in this embodiment makes no electrical contact to the silicon body 10 since it is formed upon the first insulating layer 16. The polycrystalline silicon layer may be doped N+ as it is deposited or may be deposited substantially undoped and then doped by a subsequent ion implantation and heating process. It is preferred to use the subsequent POCl$_3$ diffusion doping of the first polycrystalline silicon layer 20. The first polycrystalline silicon layer is doped to a concentration exceeding about $1 \times 10^{19}$ atoms/cm$^3$.

A silicon dioxide layer 21 may now be chemically vapor deposited or thermally grown by the previously described technique having a thickness of about 30 nanometers. A silicon nitride layer 22 which may be, for example, about 100 to 200 nanometers in thickness is formed by chemical vapor deposition by decomposing silane in ammonia at 800° C. Other oxidation masking layers or combination of layers can be substituted for the silicon nitride. Also, other silicon nitride deposition processes can be utilized. A second layer 24 of polycrystalline silicon is now deposited by use of the process utilized for forming the first layer 20 of polycrystalline silicon. This second polycrystalline silicon layer should be thicker than silicon nitride layer 22 to insure its masking related function later in the process. Also, it should be heavily doped with N+ dopant by the same means cited for layer 20 e.g. by an ion implantation process using an arsenic dose of $2 \times 10^{16}$ ions/cm$^2$ at 60 KeV. The thickness of the second polycrystalline layer is between about 250 and 750 nanometers and preferably about 500 nanometers. The heavy N+ doping enhances the polycrystalline silicon's thermal oxidation rate. A second silicon nitride layer 26 of about 50 nanometers in thickness is deposited over the layer 24.

Figure 2:
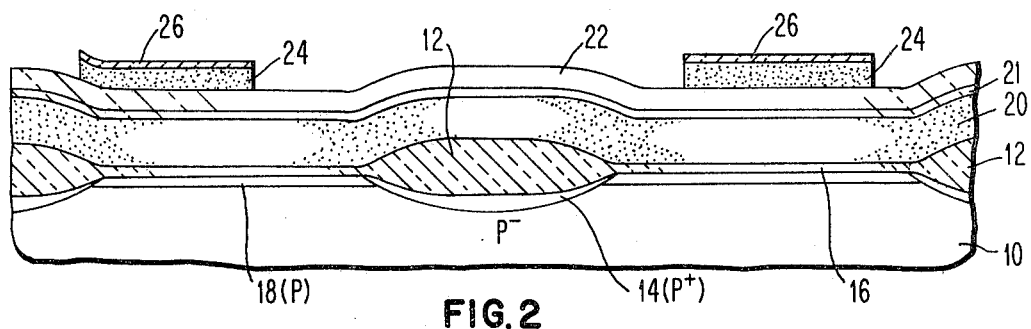

The process for forming a controlled sub-micrometer thickness layer on vertical sidewalls of the second polycrystalline silicon layer 24 may be better understood with reference to FIG. 2. Standard lithography and anisotropic etching techniques are used to produce remaining portions of the second polycrystalline silicon layer 24 having substantially vertical sidewalls which extend across certain of the designated device regions and continue onto the surrounding isolation pattern. Two of such regions 24 are shown in cross-section in FIG. 2. The etching step is preferably reactive ion etching using CF$_4$ gas for the silicon nitride layer 26 and a mixture of SF$_6$ and Cl$_2$ gases or HCl, Cl$_2$ and Argon gases for the polycrystalline silicon layer 24.

Figure 3:
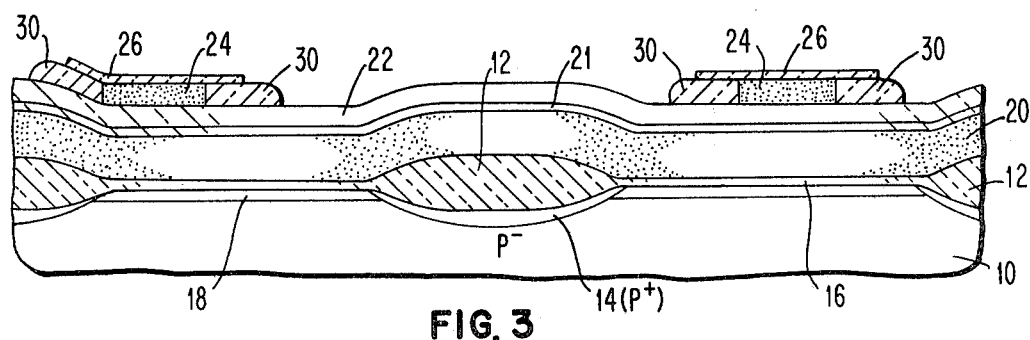

The next step is to form a controlled sub-micrometer thickness layer on the sidewalls of the polycrystalline silicon pattern 24. The preferred thickness is between about 200 to 1000 nanometers. This is preferably accomplished by a thermal oxidation of the sidewalls of the remaining portions of the polycrystalline silicon layer 24 as shown in FIG. 3. The oxidation process can very effectively control the thickness of the silicon dioxide sidewall layer 30. The layer uniformly forms upon all the vertical surfaces to an identical thickness. This oxidation cycle is preferably done at high pressure to reduce both its temperature and time. For instance, under pressure of 10 atm. and 900° C., only 2 hours are needed to grow 1 micrometer of oxide. The remaining portions of silicon nitride layer 26 and polycrystalline silicon layer 24 are next respectively removed by reactive ion etching in CF$_4$ and a wet etch of pyrocatechol, ethylene-diamine and water to leave the FIG. 4 structure with the sub-micrometer sidewall layers 30 remaining as shown.

The undesired portions of the sidewall layer 30 are removed using conventional lithography and etching techniques. The resist layer 31 masks the desired portions of sidewall layer 30 as shown in plan view in FIG. 5 and in cross-section in FIG. 6 which is the cross-section 6—6 of FIG. 5. The desired sub-micrometer channel length is shown in the left hand device region in FIGS. 4 through 6 and is defined by the width of line 30 which crosses that region. The double sidewall lines 30 in the right hand side of the FIGS. 4 through 6 can be used to form a channel length larger than twice the length of the sub-micrometer device. In this instance, each of the pair of sidewall layers 30 has a thickness between 200 and 500 nanometers.

Figure 4:
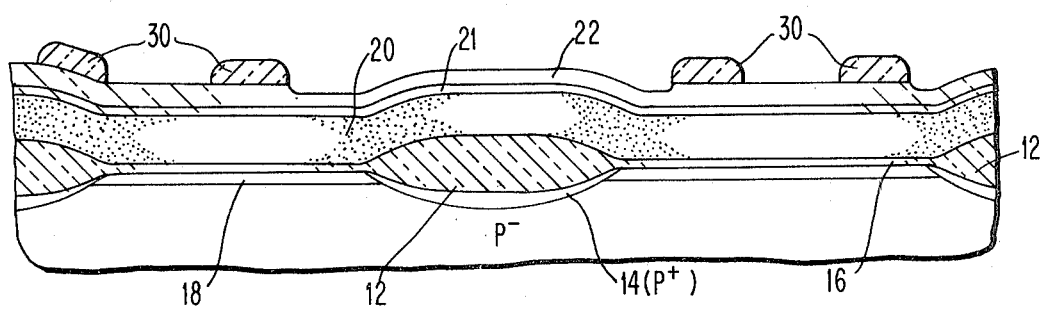
Figure 5:
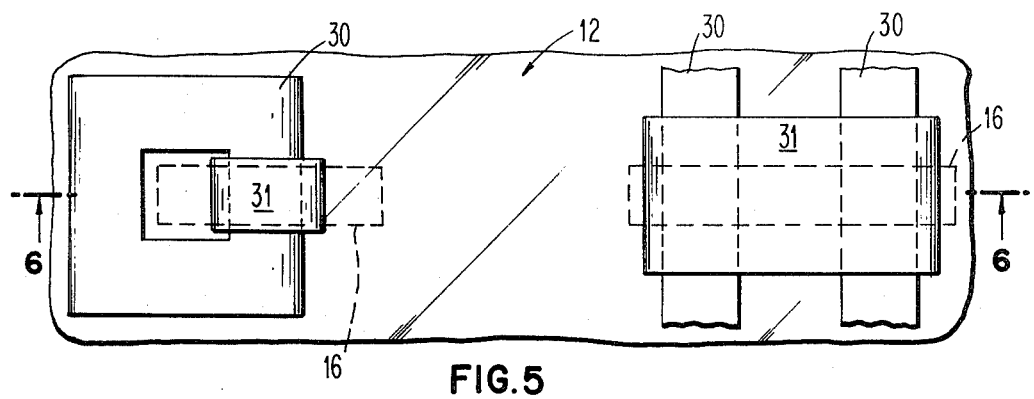
Figure 6:
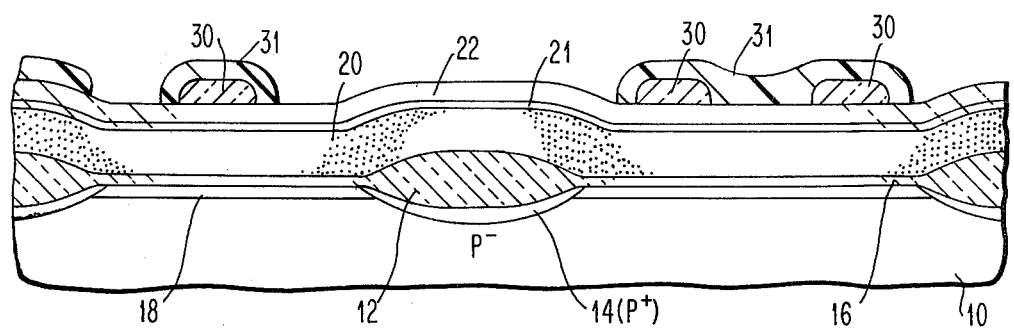
Figure 7:
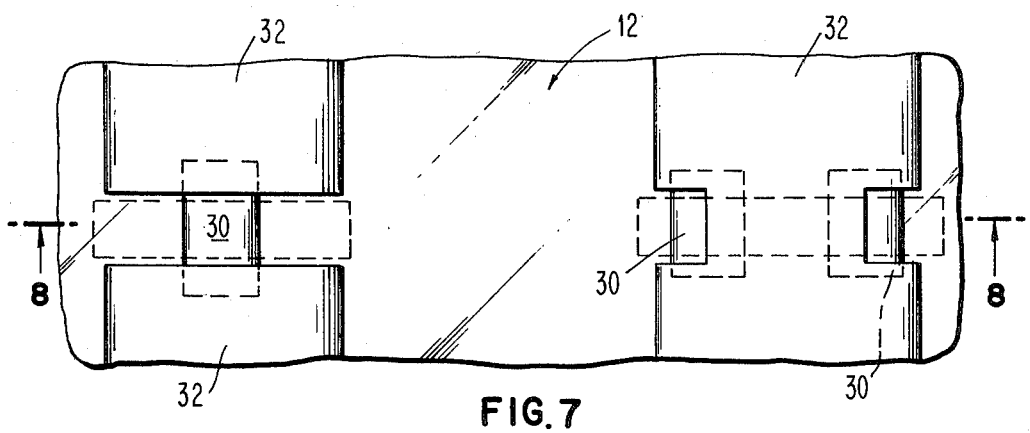

The process can continue on with exclusively the sub-micrometer channel length field effect transistors in the integrated circuit or the more than double channel length device. The controlling factor in determining which device is formed is the location of the sidewall layers 30 in relation to the isolated surface regions of monocrystalline silicon. Where the longer channel length is desired a pair of sidewall layers are made to cross an isolated silicon region as shown in FIG. 4. Where the short length device is desired a single sidewall layer crosses to isolated silicon region. However, the figures illustrate the formation of the longer channel length field effect transistor (at the right hand side of the Figs.) together with the sub-micrometer channel length transistors (at the left hand side of the Figs.).

Next, the resist layer 31 is removed. The desired pattern of device gates and interconnections in the polycrystalline silicon layer 20 is completed next. This is accomplished by depositing photoresist layer 32 which is then exposed, developed and removed in areas where it is not desired to have polycrystalline silicon interconnections to leave the pattern shown in FIG. 7 in plan view. This composite masking structure consisting of layers 30 and 32 defines the short and longer channel gate lengths for field effect transistor devices and the polycrystalline silicon interconnections between such devices and/or other devices in the integrated circuit structure.

Figure 8:
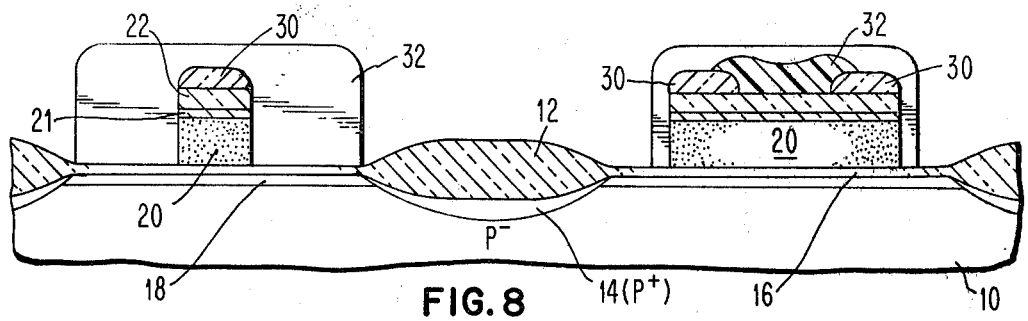

The process continues with the etching of layers 22, 21, and 20 to finally produce the polycrystalline silicon gates and interconnection of the integrated circuit structure. Faithful reproduction of the sub-micrometer length of layer 30 in the polycrystalline silicon layer 20 requires anisotropic etching so that the edges of 30 and of the transferred pattern thereunder are not eroded. Thus, reactive ion etching, being anisotropic, is used throughout. Silicon nitride layer 22 and silicon dioxide layer 21 may be etched in a CF$_4$ plasma. Since their etching rates are comparable, the whole of the silicon dioxide layer 30 will also be etched unless it is thicker than layer 22. In FIG. 8, layer 30 is still shown after the etching operation is completed because polycrystalline silicon layer 24 was chosen thicker than the silicon nitride layer 22. If this is not the case, the gate length defined by 30 is still faithfully transferred to the silicon nitride layer 22, because the anisotropic etching does not erode the edges of 30. The sub-micrometer gate length is now transferred from the newly etched nitride mask to the polycrystalline silicon layer 20 by reactively etching in a plasma containing a mixture of SF$_6$ and Cl$_2$ or CCl$_4$, HCl and Ar to obtain the desired cross-section of FIG. 8. The portions of layer 20 under photoresist layer 32 are simultaneously etched. However, dimensional control is not as good since the photoresist edges may be degraded by the reactive plasma. The photoresist layer 32 is now removed.

Figure 9:
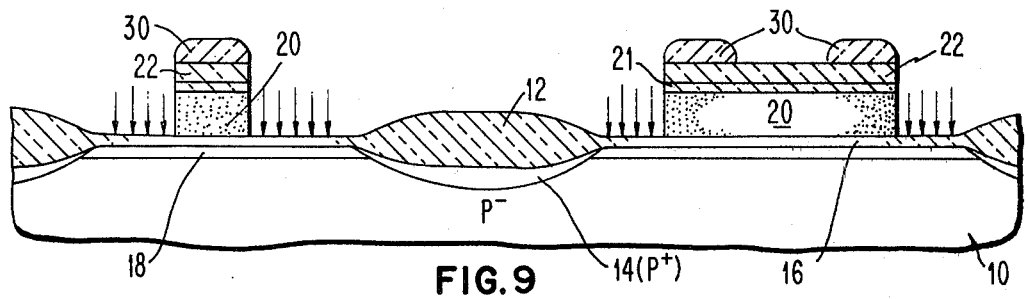
Figure 10:
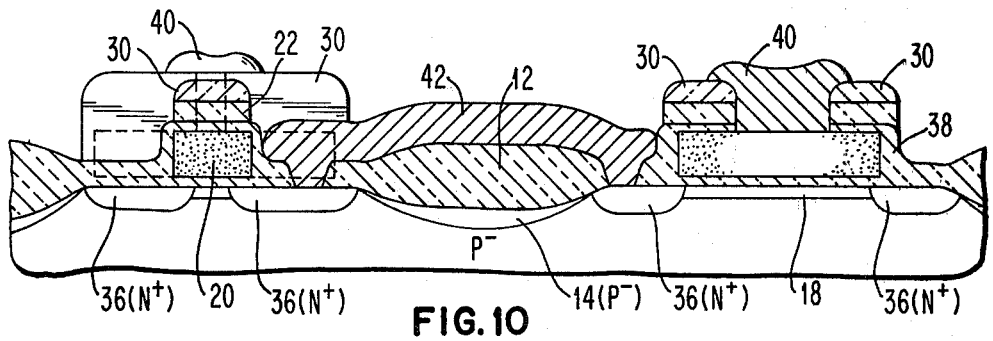
Figure 11:
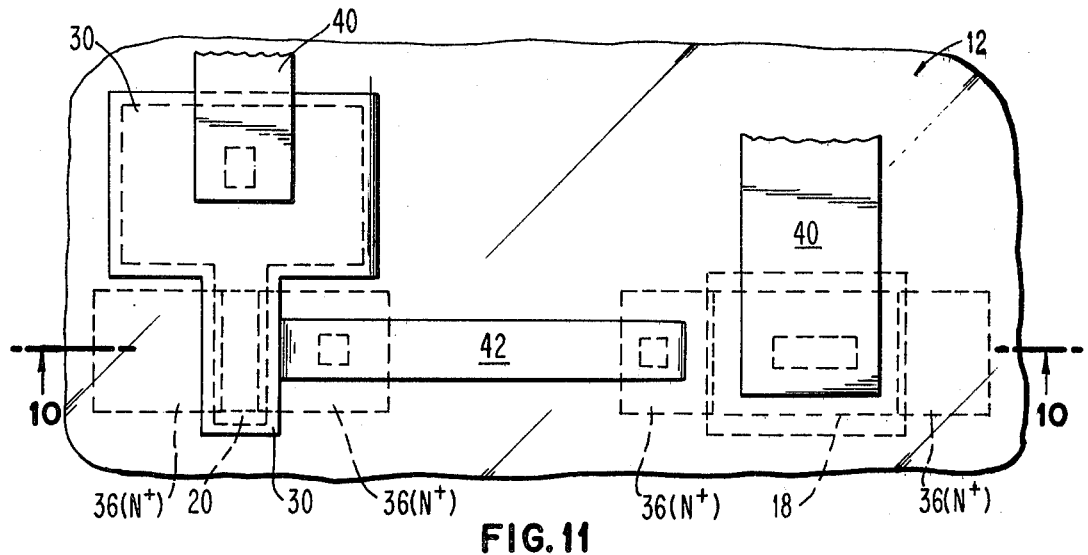

The exposed gate dielectric silicon dioxide layer 16 can either be removed by etching followed by the ion implantation or diffusion of phosphorus or arsenic dopants, or the silicon dioxide layer can be allowed to remain and ion implantation used to penetrate the silicon dioxide layer to form the N+ source/drain regions in the device areas. Where the first alternative is utilized it is necessary to reoxidize the exposed silicon surface to form a silicon dioxide layer thereon. It is preferred to blanket implant arsenic ions of a dosage of $5 \times 10^{15}$ to $1 \times 10^{16}$ ions/cm$^2$ at about 70 Kev as shown in FIG. 9. The arsenic is driven to the desired junction depth of about 0.3 micrometer and underlap the polycrystalline silicon gate regions while simultaneously growing about 200 nanometers of silicon dioxide layer 38 over the N+ source/drain regions 36 and polycrystalline silicon sidewalls. Conventional lithography and etching techniques are utilized to open contacts to the various elements of the field effect transistor devices. Blanket metallization and delineation is then made by conventional lithography and etching or lift-off techniques to form the electrical contacts 40 to the various elements of the field effect transistor devices and conductors as shown in FIG. 10 which is a cross-section taken along 10—10 of FIG. 11. Conductive layer 42 connects the two illustrated devices in this illustration.

It is also feasible to form a polycide layer on top of the first polycrystalline silicon layer to lower its sheet resistance without disturbing the essential features of the invention, especially those related to anisotropic etching. For instance, details of reactive ion etching of tungsten polycide are described in an article by L. Ephrath, published in the *IEEE Transactions on Electron Devices*, Vol. ED28, No. 11, Nov. 1981, pp. 1315-1319. Alternatively, the first polycrystalline silicon layer can be wholly replaced with a metal silicide. The metal silicides which are useful are $WSi_2$, $TaSi_2$, $PdSi_2$, $PtSi_2$, or the like.

While the invention has been particularly shown and described with reference to the preferred embodiments thereof, it will be understood by those skilled in the art that various changes in form and detail may be made therein without departing from the spirit and scope of the invention. For example, since this technology can be applied to N channel devices and P channel devices separately, it is obvious for people skilled in the art to combine the two and develop through some additional steps a complementary MOS field effect transistor self-aligned polycrystalline silicon gate technology.

What is claimed is:

1. A method for fabricating a semiconductor integrated circuit structure having at least some field effect transistor devices having a sub-micrometer gate length, comprising:
   providing a semiconductor substrate;
   forming a surface isolation pattern in said semiconductor substrate which isolates regions of said semiconductor within said substrate from one another and which regions are designated to contain devices;
   forming a silicon dioxide layer which is designated to be in part the gate dielectric upon the surface of said substrate having the surface isolation pattern therein;
   depositing a conductive layer upon said silicon dioxide layer;
   depositing an insulating layer on said conductive layer;
   depositing a first silicon nitride layer on said conductive layer;
   depositing a doped polycrystalline silicon layer upon said silicon nitride layer;
   depositing a second silicon nitride layer on said polycrystalline silicon layer;
   selectively etching said second silicon nitride layer and said polycrystalline silicon layer so as to provide remaining portions of said polycrystalline silicon layer having substantially vertical sidewalls, wherein portions of said remaining portions extend across certain of said regions designated to contain devices and onto the surrounding isolation pattern;
   thermally oxidizing each of said sidewalls to form a silicon dioxide sidewall layer thereon;
   etching said remaining portions of said polycrystalline silicon layer and overlying second silicon nitride layer;
   removing the undesired portions of said silicon dioxide sidewall layer;
   using said sidewall layer as a mask, etch said first silicon nitride layer, and said conductive layer to form the gate electrode of said field effect transistor devices in said conductive layer having the length of said sidewall coating;
   ion implanting a conductivity imparting impurity adjacent to said gate electrode to form a source/drain element for said field effect devices in said regions designated to contain devices; and
   forming an insulation layer over said device with openings therein having electrical contacts to the various elements of said devices.

2. The method of claim 1 wherein said conductive layer is polycrystalline silicon.

3. The method of claim 1 wherein said conductive layer is a combination layer of polycrystalline silicon and metal silicide.

4. The method of claim 1 wherein said conductive layer is a metal silicide.

5. The method of claim 1 wherein the said isolation pattern is principally silicon dioxide.

6. The method of claim 2 wherein the said etching of said polycrystalline silicon layer is an anisotropic process.

7. The method of claim 1 wherein said sidewall layer has a thickness of between about 200 to 1000 nanometers which produces a field effect transistor with short channel length of substantially the same dimensions as said sidewall layer.

8. The method of claim 1 wherein said conductivity imparting impurities are N type to produce an N channel field effect transistor.

9. The method of claim 7 including forming other field effect transistors having channel lengths substantially greater than said field effect transistors with said short channel length in other of said regions designated to contain devices.

10. The method of claim 1 wherein said polycrystalline silicon layer is N+ type and is doped by ion implantation process using an arsenic dose of $2 \times 10^{16}$ ions/cm$^2$.

11. The method of claim 10 wherein said thermal oxidizing is done in a steam ambient under a pressure of several atmospheres.

12. A method for fabricating a semiconductor integrated circuit structure having at least some field effect transistor devices having a sub-micrometer gate length, comprising:

providing a semiconductor substrate;
forming a surface isolation pattern in said semiconductor substrate which isolates regions of said semiconductor within said substrate from one another and which regions are designated to contain devices;
forming a silicon dioxide layer which is designated to be in part the gate dielectric upon the surface of said substrate having the surface isolation pattern therein;
depositing a conductive layer upon said silicon dioxide layer;
depositing an insulating layer on said conductive layer;
depositing a first silicon nitride layer on said conductive layer;
depositing a doped polycrystalline silicon layer upon said first silicon nitride layer;
depositing a second silicon nitride layer on said polycrystalline silicon layer;
selectively etching said second silicon nitride layer and said polycrystalline silicon layer so as to provide remaining portions of said polycrystalline silicon layer having substantially vertical sidewalls, wherein portions of said remaining portions extend across certain of said regions designated to contain devices and onto the surrounding isolation pattern;
thermally oxidizing each of said sidewalls to form a silicon dioxide sidewall layer thereon, the said portions being so positioned that at least a pair of said sidewall layers extend across said certain of said regions to thereby define the gate region;
etching said remaining portions of said polycrystalline silicon layer and overlying silicon nitride layer;
removing the undesired portions of said silicon dioxide sidewall layer;
forming a resist pattern to cover the desired interconnection pattern of said conductive layer outside of the designated gate electrode over said isolation regions;
using said sidewall layer and said resist pattern as a mask, etching said first silicon nitride layer and said conductive layer to form the said gate electrode of said field effect transistor devices and device interconnection pattern in said conductive layer;
removing said resist pattern;
ion implanting a conductivity imparting impurity adjacent to said gate electrode to form the desired a source/drain element for said field effect devices in said regions designated to contain devices; and
forming an insulation layer over said devices with openings therein having electrical contacts to the various elements of said devices.

13. The method of claim 12 wherein said conductive layer is a second polycrystalline silicon layer.

14. The method of claim 12 wherein said conductive layer is a combination layer of polycrystalline silicon and metal silicide.

15. The method of claim 12 wherein said conductive layer is a metal silicide.

16. The method of claim 12 wherein each of said pair of sidewall layers has a thickness between about 200 to 500 nanometers and the resulting said gate electrode is larger than twice the length of said sidewall layer.

17. The method of claim 12 wherein said polycrystalline silicon layer is N+ type and is doped by an ion implantation process using $2 \times 10^{16}$ arsenic ions/cm$^2$ at 60 KeV.

18. The method of claim 12 wherein said thermal oxidizing is done in a steam ambient under a pressure of several atmospheres.

19. The method of claim 12 wherein said electrical contact to said gate electrode is between said pair of said sidewall layers.

20. A method for fabricating a semiconductor integrated circuit structure having at least some field effect transistor devices having a sub-micrometer gate length and some field effect transistor devices having gate lengths larger than two times said sub-micrometer gate length, comprising:
providing a semiconductor substrate;
forming a surface isolation pattern in said semiconductor substrate which isolates regions of said semiconductor within said substrate from one another and which regions are designated to contain devices;
forming a silicon dioxide layer which is designated to be in part the gate dielectric upon the surface of said substrate having the surface isolation pattern therein;
depositing a first doped polycrystalline silicon layer upon said silicon dioxide layer;
depositing an insulating layer on said first polycrystalline silicon layer;
depositing a first silicon nitride layer on said first polycrystalline silicon layer;
depositing a second doped polycrystalline silicon layer upon said silicon nitride layer;
depositing a second silicon nitride layer on said second polycrystalline silicon layer;
selectively etching said second silicon nitride layer and said second polycrystalline silicon layer so as to provide remaining portions of said second polycrystalline silicon layer having substantially vertical sidewalls, wherein portions of said remaining portions extend across certain of said regions designated to contain devices and onto the surrounding isolation pattern;
thermally oxidizing each of said sidewalls to form a silicon dioxide sidewall layer thereon;
the said portions above said regions designated to have said sub-micrometer gate length having one sidewall layer extending across said certain of said regions;
the said portions above said regions designated to have said larger than two times said sub-micrometer gate length having a pair of said sidewall layers extending across said certain of said regions;
etching said remaining portions of said second polycrystalline silicon layer and overlying second silicon nitride layer;
removing the undesired portions of said sidewall layer;
forming a resist pattern to cover the desired interconnection pattern of said first polysilicon layer outside of the said designated larger than two times the sub-micrometer gate electrode regions, and the inside portion thereof between said pair of said sidewall layers, and to cover the interconnection pattern of said first polysilicon layer over said surface isolation pattern whereat it is an enlarged size area for contact purposes to said sub-micrometer gate length device;
using said sidewall layer and said resist pattern as a mask, etching the first silicon nitride layer and said first polycrystalline silicon layer to form the said gate electrode of said field effect transistor devices and device interconnection pattern in said first polycrystalline silicon layer;

removing said resist pattern;

ion implanting a conductivity imparting impurity adjacent to said gate electrode to form the desired source/drain element for said field effect devices into said regions designated to contain devices; and forming an insulation layer over said device with openings therein having electrical contacts to the various elements of said devices.

21. The method of claim 20 wherein said sidewall layer has a thickness of between about 200 to 1000 nanometers which produces said field effect transistor devices with said sub-micrometer gate length and said field effect transistor devices having a gate length larger than two times said sub-micrometer gate length.

22. The method of claim 20 wherein said electrical contacts to said gate electrode of said sub-micrometer gate length devices are over said insulation layer and said electrical contacts for said larger than two times gate length devices are between said pair of said sidewall layer.

23. The method of claim 20 wherein said first and second polycrystalline silicon layers and said source/drain element are doped with N type impurities.

24. The method of claim 23 wherein said conductivity imparting impurity is arsenic ion implanted using a dose of between about $5 \times 10^{15}$ to $1 \times 10^{16}$ ions/cm$^2$ at about 70 KeV to form a source/drain PN junction of 0.3 micrometer deep.

* * * * *